(12) United States Patent
Lee et al.

(10) Patent No.: US 8,289,770 B2
(45) Date of Patent: Oct. 16, 2012

(54) SEMICONDUCTOR MEMORY DEVICE AND SYSTEM INCLUDING THE SAME

(75) Inventors: Jin-Yub Lee, Seoul (KR); Su-Chang Jeon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/552,738

(22) Filed: Sep. 2, 2009

(65) Prior Publication Data

US 2010/0067312 A1 Mar. 18, 2010

(30) Foreign Application Priority Data

Sep. 12, 2008 (KR) .................. 10-2008-0090093

(51) Int. Cl.
*G11C 11/34* (2006.01)
(52) U.S. Cl. .................................................. 365/185.09
(58) Field of Classification Search .................. 365/185, 365/189
See application file for complete search history.

(56) References Cited

U.S. PATENT DOCUMENTS

| 7,280,415 | B2 * | 10/2007 | Hwang et al. | 365/189.09 |
| 2005/0063230 | A1 * | 3/2005 | Seitoh | 365/201 |
| 2008/0126676 | A1 * | 5/2008 | Li et al. | 711/103 |
| 2008/0259685 | A1 * | 10/2008 | Makino | 365/185.03 |
| 2009/0282305 | A1 * | 11/2009 | Chen et al. | 714/718 |

FOREIGN PATENT DOCUMENTS

| JP | 08-190510 | 7/1996 |
| JP | 2000-195296 | 7/2000 |
| KR | 1020030016554 A | 3/2003 |
| KR | 1020050108773 A | 11/2005 |

* cited by examiner

*Primary Examiner* — Hoai V Ho
*Assistant Examiner* — Min Huang
(74) *Attorney, Agent, or Firm* — Volentine & Whitt, PLLC

(57) ABSTRACT

A semiconductor memory device includes a memory core and a fail detection circuit. The memory core includes a memory cell array having a plurality of memory cells. The fail detection circuit compares read data with test data to generate a comparison signal representing whether each of the memory cells is failed or not, and accumulates and stores fail information of the memory cells corresponding to a plurality of addresses to output accumulated fail information. The read data are read out from the memory cells in which the test data are written.

18 Claims, 8 Drawing Sheets

SEMICONDUCTOR MEMORY DEVICE AND SYSTEM INCLUDING THE SAME

CROSS-REFERENCE TO RELATED APPLICATIONS

A claim for priority under 35 USC §119 is made to Korean Patent Application No. 2008-0090093, filed on Sep. 12, 2008, the entirety of which is incorporated herein by reference.

BACKGROUND

The inventive concepts described herein are generally related to a semiconductor memory device, and more particularly to a semiconductor memory device that provides effective testing of the memory, and a system including the semiconductor memory device.

As semiconductor memory devices become more highly integrated, the memory capacity of semiconductor memory devices has rapidly increased. The increased memory capacity is in part due to the development of semiconductor manufacturing techniques, which enables an increase of the number of memory cells included in one chip. However, as the number of total memory cells increases, the number of failed memory cells may increase also. Even a single failed memory cell may result in a critical defect in a semiconductor memory device. Failed memory cells should thus be replaced with the normal memory cells. Semiconductor memory devices typically include redundant memory cells to be substituted for failed memory cells based on fail information.

In general, the type of testing techniques needed to test a semiconductor device is a design/production concern that may be as considerable as improving density and complexity of the semiconductor device itself. Reduction of time and cost as well as improvement of testability may be required for mass production of a semiconductor memory device. Thus, there is a need for a design-for-test (DFT) scheme for improving efficiency of testing during a design phase of the semiconductor memory device.

SUMMARY

Exemplary embodiments of the inventive concept are generally related to providing a semiconductor memory device for efficiently providing fail information required to perform repair operation on failed memory cells.

In an embodiment of the inventive concept a system is provided including a semiconductor memory device which effectively provides the fail information required to perform the repair operation on the failed memory cells.

In a further embodiment of the inventive concept, a test system is provided including a semiconductor memory device for effectively providing the fail information required to perform the repair operation on the failed memory cells.

In some example embodiments of the inventive concept, a semiconductor memory device includes a memory core and a fail detection circuit. The memory core includes a memory cell array having a plurality of memory cells. The fail detection circuit compares read data with test data to generate a comparison signal representing whether the memory cell is failed or not, and stores and accumulates fail information of the memory cells corresponding to a plurality of addresses based on the comparison signal, to output accumulated fail information. The test data are written into the memory cells, and the read data are read out from the memory cells in which the test data are written.

The fail detection circuit may accumulate and store the fail information of the memory cells corresponding to a plurality of lower address different from each other and corresponding to an upper address identical to each other. The accumulated fail information may represent whether the memory cells corresponding to the upper address are failed or not with respect to each column of the memory cell array.

The upper address may designate a memory block, and the lower address may designate a word line or a page of the memory block.

The fail detection circuit may include a fail bit indicator for storing temporary accumulated fail information and outputting the accumulated fail information, and a comparison circuit. The comparison circuit may sequentially generate the comparison signal, and generate an update signal. The fail bit indicator may store temporary accumulated fail information and output the accumulated fail information based on the update signal.

The fail bit indicator may include a plurality of registers a number of which is the same as a number of bits of the read data output from the memory core with respect to each read operation.

The comparison circuit may include a comparator and a logic gate. The comparator may generate the comparison signal based on the read data and the test data. The logic gate may generate the update signal based on a state signal and the comparison signal. The state signal may represent the temporary fail information stored in the fail bit indicator. For example, the logic gate may be an OR logical gate that performs a logical OR operation.

In a case where the comparison circuit includes the comparator and the logic gate, the fail bit indicator may include a plurality of latches a number of which is the same as a number of bits of the read data output from the memory core with respect to each read operation.

The comparator may include a comparator generating the comparison signal based on the read data and the test data, and a logic gate generating the update signal based on a clock signal and the comparison signal. The update signal may have a pulse form. For example, the logic gate may perform a logical NAND operation. The fail bit indicator may include a plurality of flip-flops a number of which is the same as a number of bits of the read data output from the memory core with respect to each read operation.

The memory cell array may correspond to a flash memory cell array, and the memory core may further include a page buffer commonly connected to a plurality of memory blocks included in the flash memory cell array. The fail detection circuit may include a plurality of registers a number of which is the same as a number of bits corresponding to one page of the flash memory cell array.

The semiconductor memory device may further include a register unit storing the test data.

In some embodiments, a system includes a semiconductor memory device and a host for controlling the semiconductor memory device. The semiconductor memory device includes a memory core and a fail detection circuit. The memory core includes a memory cell array having a plurality of memory cells. The fail detection circuit compares read data with test data, generates a comparison signal representing whether the memory cell is failed or not, stores and accumulates fail information of the memory cells corresponding to a plurality of addresses based on the comparison signal to output accumulated fail information. The read data are read from the memory cell in which the test data are written.

The fail detection circuit may include a fail bit indicator and the comparison circuit. The fail bit indicator may store temporary accumulated fail information and output the accumulated fail information. The comparison circuit may sequentially generate the comparison signal with respect to the lower address and generate an update signal for updating the temporary accumulated fail information based on the comparison signal.

The fail bit indicator may include a plurality of registers a number of which is the same as a number of bits of the read data output from the memory core with respect to each read operation.

The host may perform a repair operation on the failed memory cells included in the memory cell array with respect to each column based on the accumulated fail information.

The host may correspond to a tester for testing the semiconductor memory device. The tester may perform a repair operation on failed memory cells based on the accumulated fail information by using at least one of a laser fuse cutting process and an electrical fusing process.

The host may include a memory controller, and the memory controller may perform a repair operation on failed memory cells by mapping an address of the failed memory cell to an address of a redundant memory cell.

In some embodiments, a test system includes a plurality of semiconductor memory devices and a tester for testing the semiconductor memory devices in parallel. The semiconductor device respectively includes a memory core including a memory cell array having a plurality of memory cells and a fail detection circuit. The fail detection circuit compares read data with test data to generate a comparison signal representing whether the memory cells are failed or not, and accumulates and stores fail information of the memory cells corresponding to a plurality of addresses based on the comparison signal to output accumulated fail information. The test data are written into the memory cells, and the read data are read out from the memory cells in which the test data are written.

The fail detection circuit may include a fail bit indicator and a comparison circuit. The fail bit indicator may store temporary accumulated fail information and output the accumulated fail information. The comparison circuit may sequentially generate the comparison signal with respect to lower address and generate an update signal. The fail bit indicator may update the temporary accumulated fail information based on the update signal.

Consequently, the semiconductor memory device accumulatively stores the fail information therein during test operation so that time and cost for testing may be reduced. The semiconductor memory device may adaptively use various patterns of test data according to purposes or items of the test operation.

The system including the semiconductor memory device according to the inventive concept may reduce time for providing the fail information required for the repair operation to improve performance of the system. The test system may reduce the memory capacity for storing the fail information as well as reduce the time and cost for the test, so that the test system may thus effectively perform the repair operation.

BRIEF DESCRIPTION OF THE DRAWINGS

The accompanying drawings provide a further understanding of the embodiments of the inventive concept and together with the description serve to explain principles of the embodiments of the inventive concept, and wherein.

DETAILED DESCRIPTION OF THE EMBODIMENTS

Figure 1:
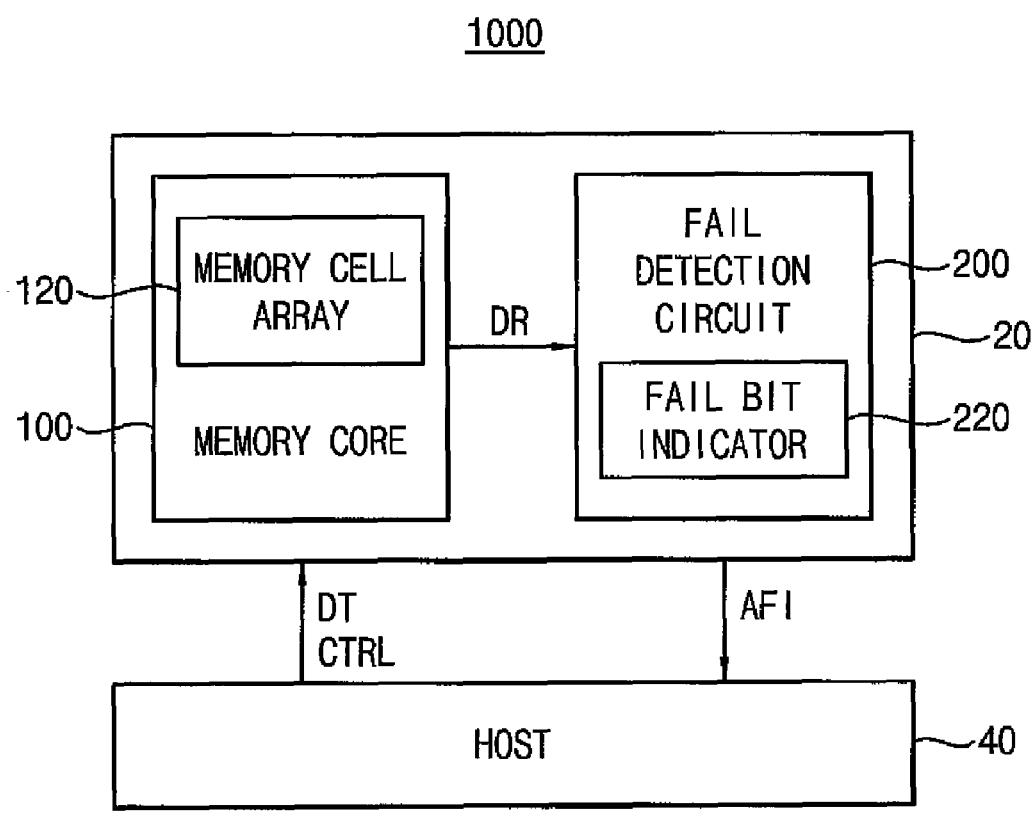
FIG. 1 is a block diagram illustrating a system according to an embodiment of the inventive concept.

Embodiments of the inventive concept will now be described more fully with reference to the accompanying drawings. The inventive concept may however be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It should be understood that, although the terms first, second, etc. may be used herein to describe various elements, these elements should not be limited by these terms. These terms are used to distinguish one element from another. For example, a first element could be termed a second element, and similarly a second element could be termed a first element, without departing from the scope of the inventive concept. As used herein, the term "and/or" includes any and all combinations of one or more of the associated listed items.

It should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a system according to an embodiment of the inventive concept. Referring to FIG. 1, system 1000 may include a semiconductor memory device 20, and a host 40 controlling the semiconductor memory device 20. The semiconductor memory device 20 may include a memory core 100 and a fail detection circuit 200. The memory core 100 may include a memory cell array 120 having a plurality of memory cells. The memory cell array 120 may include a plurality of memory blocks. Each of the memory blocks may include a plurality of memory cells connected to a word line in a row direction and to a bit line in a column direction, such that the plurality of memory cells are arranged in a matrix form.

The fail detection circuit 200 compares read data DR with test data DT to generate a comparison signal representing whether each of the memory cells is failed or not. The fail detection unit 200 accumulates and stores fail information of the memory cells corresponding to a plurality of addresses based on the comparison signal, and outputs accumulated fail information AFI based on the stored values. The read data DR are obtained by reading out from the corresponding memory cells in which the test data DT are previously written. The fail detection circuit 200 may include a fail bit indicator 220 for storing temporary accumulated fail information and for outputting the accumulated fail information AFI.

The host 40 may provide a control signal CTRL and the test data DT to the semiconductor memory device 20, and receive the accumulated fail information AFI from the semiconductor memory device 20. Conventional operations related to controlling the semiconductor memory device, such as a reading operation and a write operation, will be omitted for the sake of brevity, and test operations according to embodiments of the inventive concept will be subsequently described.

In general, an electrical test is performed to screen for defects which may have occurred after the wafer is fabricated or after the semiconductor memory devices are packaged. During such an electrical test, a tester may examine characteristics and defects of the semiconductor memory device. Based on examination results, a repair test, an invalid block masking test and so on may be performed.

Since the possibility that all the memory cells correctly operate may become decreased as memory capacity increases, redundant memory cells are included in the semiconductor memory device to be substituted for failed memory cells during the repair test. The semiconductor memory device may include a relatively small amount of redundant memory cells, and a defective semiconductor memory device may thus be repaired using the redundant memory cells. For example, the repair operation may be performed by a laser cutting process or an electrical fusing process.

Memory devices having a relatively large memory capacity such as a NAND flash memory device may be considered non-defective when the number of defective memory blocks is within an allowed margin. In the invalid block masking test, the defective memory blocks are marked so that a user may recognize the defective memory blocks. As such, the fail information indicating addresses of the failed memory cells is required during a test operation after wafer fabrication or packaging the semiconductor memory device.

In some of the inventive concept embodiments, system 1000 may correspond to a test system for examining the characteristics and defects of the semiconductor memory devices after the manufacturing process or packaging process, and particularly host 40 may perform the electrical test. For example, system 1000 may correspond to another arbitrary system other than the test system. The defects may occur in the memory cells included in the semiconductor memory device 20 due to repeated use after the semiconductor memory device 20 has passed the test operation. In this case, through logical address mapping, physical addresses of the failed memory cells may be replaced with physical addresses of normal memory cells such as the redundant memory cells, and then malfunctions of the whole semiconductor memory device and the system may be prevented. The host 40 may include a memory controller (not shown) performing the repair operation, or a central processing unit (CPU) (not shown) performing other original functions as well as controlling of the semiconductor memory device 20. The host 40 tests the semiconductor memory device 20, receives the accumulated fail information AFI from the semiconductor memory device 20, and performs the repair operation periodically or irregularly depending on requirements.

The semiconductor memory device 20 may be repaired with respect to each row or each column. For example, when at least one of memory cells included in one row has a defect, all of the memory cells included in the row may be substituted by another row of the redundant memory cells.

For example, a read operation may be performed on each page in a flash memory device. Conventionally, data stored in the memory cells included in all of the pages of one memory block is output to an external device and information required for the repair operation is obtained in the exterior device. When the flash memory device includes a memory cell array having 'k' memory blocks and each of the memory blocks has 'p' pages, the external device receives the information k*p times.

The semiconductor memory device 20 according to some embodiments of the inventive concept internally accumulates and stores the fail information required for the repair operation, and outputs the accumulated fail information AFI to an external device, that is, to the host 40 such as the tester. The accumulated fail information AFI may be generated by accumulating the fail information of a predetermined number of memory cells such as all the memory cells included in one memory block. In this case, the host 40 receives the fail information of the memory cells, which is the accumulated fail information AFI, k times corresponding to a number of the memory blocks in the memory cell array. Accordingly, transfer time of the fail information between the host 40 such as the tester and the semiconductor memory device 20 may be significantly reduced. The test system according to some embodiments may thus increase a manufacturing efficiency of mass production of the semiconductor memory device 20 by reducing the test time. In case that the system in FIG. 1 is another system other than the test system, overall performance of the system may be improved by reducing a time required for the repair operation.

Figure 2:
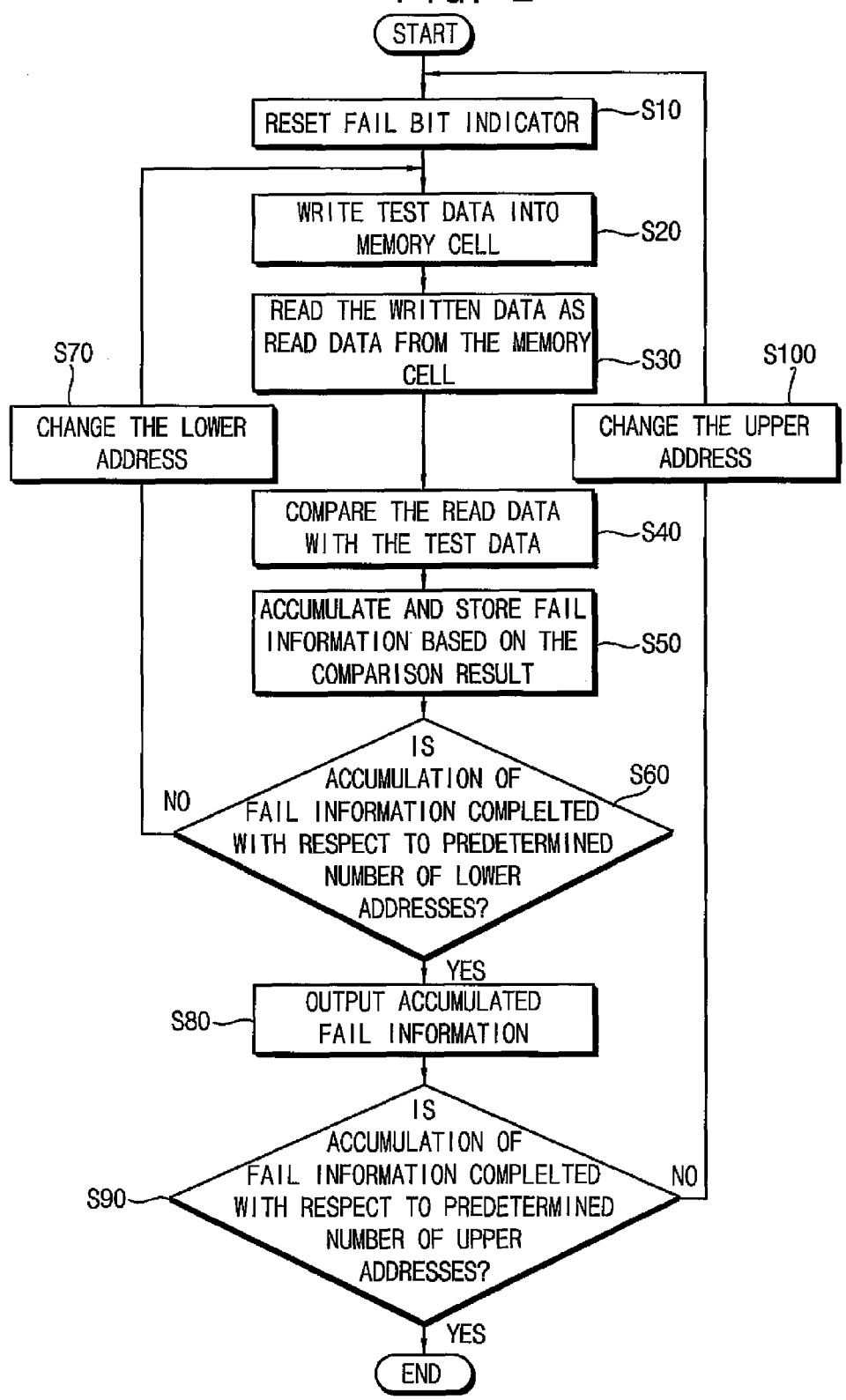
FIG. 2 is a flow chart illustrating a method of testing the semiconductor memory device according to some embodiments of the inventive concept.

FIG. 2 is a flow chart illustrating a method of testing the semiconductor memory device according to some embodiments of the inventive concept. Referring to FIG. 2, the fail bit indicator 220 is reset to an initial state (Step S10). The test data is written into the memory cell (Step S20) and the written test data is read out from the memory cell as the read data (Step S30). The read data are compared with the original test data (Step S40). The fail information is accumulated and stored in the fail bit indicator 220 based on a comparison result (Step S50). When the accumulation of the fail information is not completed with respect to a predetermined number of lower addresses (Step S60: No), the lower address is changed (Step S70) and the above-mentioned operations (Steps S20, S30, S40 and S50) for accumulating the fail information are repeated with respect to the changed lower address. When the accumulation of the fail information is completed with respect to the predetermined number of the lower addresses (Step S60: Yes), the accumulated fail information is output (Step S80). When the output of the accumulated fail information is not completed with respect to a predetermined number of upper addresses (Step S90: No), the upper address is changed (Step S100). The fail bit indicator 220 is reset to the initial state, and then above-mentioned operations (Steps S20, S30, S40, S50, S60, S70 and S80) for outputting the accumulated fail information are repeated with respect to the changed upper address. When the output of the accumulated fail information is completed with respect to the predetermined number of the upper addresses (Step S90: Yes), the test operation is terminated. For example, the upper address may correspond to an address designating the memory block, and the lower address may correspond to an address designating a word line or a page included in the memory block.

Figure 3:
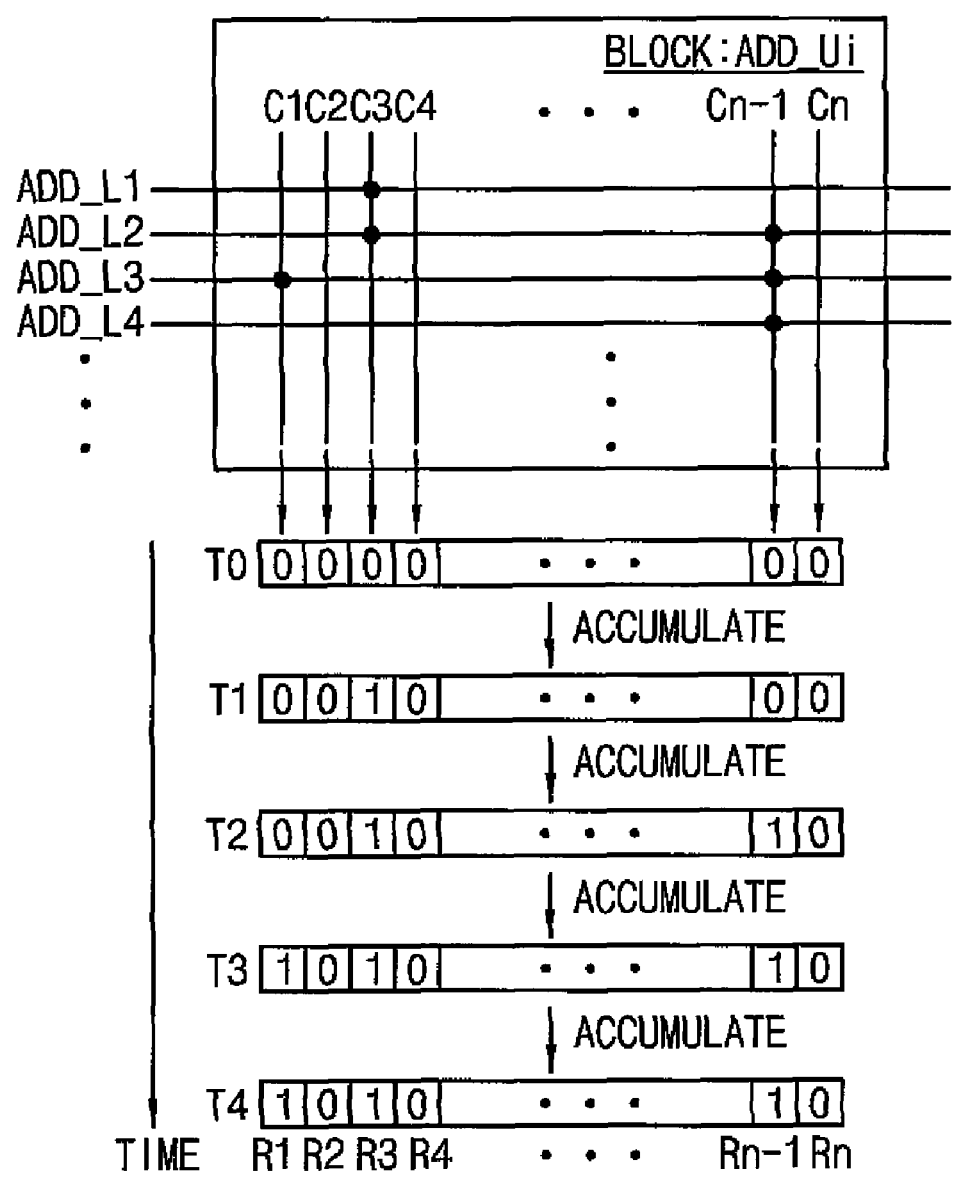
FIG. 3 is a diagram for describing an example of the test operation of the semiconductor memory device included in the system of FIG. 1.

FIG. 3 is a diagram for describing an example of the test operation of the semiconductor memory device included in the system of FIG. 1. In FIG. 3, examples of defect states of the memory block corresponding to one upper address ADD_Ui and the respective temporary accumulated fail information stored in the fail bit indicator 220 with respect to each accumulation are illustrated. The temporary accumulated fail information corresponds to a currently stored value in the fail bit indicator 220. In some examples, the fail bit indicator 220 updates the temporary accumulated fail information with respect to each lower address. After the test operation is performed on the every lower addresses ADD_Li (i=1, 2, 3, 4, . . . ) pertaining to one upper address ADD_Ui, the temporary accumulated fail information is output as the accumulated fail information AFI with respect to the upper address ADD_Ui.

The initial state T0 represents a state of the fail bit indicator 220 when the fail bit indicator 220 is reset, a first state T1 represents a state of the fail bit indicator 220 after the test operation is performed on a first lower address ADD_L1, and a second state T2 represents a state of the fail bit indicator 220 after the test operation is performed on a second lower address ADD_L2. As such, FIG. 3 illustrates four states T1, T2, T3 and T4 respectively representing the states of the fail bit indicator 220 when the test operations are sequentially performed with respect to four lower addresses ADD_L1, ADD_L2, ADD_L3 and ADD_L4.

Referring to the initial state T0, all of bits R1 through Rn of the temporary accumulated fail information in the fail bit indicator 220 are reset to a value of "0". Referring to the first state T1 after the test operation is performed on the first lower address ADD_L1, since the memory cell included in a third column C3 of the first lower address ADD_L1 has a defect, a third bit R3 of the temporary accumulated fail information of the first state T1 is changed from the value of "0" to a value of "1". Referring to the second state T2 after the test operation is performed on the second lower address ADD_L2, since memory cells corresponding to a third column C3 and a (n−1)-th column Cn−1 of the second lower address ADD_L2 have defects, the third bit R3 of the temporary accumulated fail information of the second state T2 maintains the previous value of "1" and an (n−1)-th bit Rn−1 of the temporary accumulated fail information of the second state T2 is changed from the value of "0" to the value of "1". Referring to the third state T3 after the test operation is performed on the third lower address ADD_L3, since memory cells corresponding to a first column C1 and an (n−1)-th column of the third lower address ADD_L3 have defects, a first bit R1 of the temporary accumulated fail information of the third state T3 is changed from the value of "0" to the value of "1" and the (n−1)-th bit Rn−1 of temporary accumulated fail information of the third state T3 maintains the previous value of "1". Referring to the fourth state T4 after the test operation is performed on the fourth lower address ADD_L4, since a memory cell corresponding to an (n−1)-th column Cn−1 of the fourth lower address ADD_L4 has defect, the (n−1)-th bit Rn−1 of the temporary accumulated fail information of the third state T3 maintains the previous value of "1", and thus the (n−1)-th bits Rn−1 of the temporary accumulated fail information of the third and fourth states T3 and T4 are the same.

As such, the fail information may be accumulated and stored as the temporary accumulated fail information with respect to each column (i.e., by unit of column). In this case, a bit value of the temporary accumulated fail information corresponding to a column including at least one defective memory cell corresponds to the value of "1" and a bit value of the temporary accumulated fail information corresponding to a column which exclusively includes normal memory cells consequently maintains the initial value of "0". After the test operation is performed on all of the lower addresses included in memory blocks corresponding to the predetermined upper address ADD_Ui, each bit value of the temporary accumulated fail information is output as the accumulated fail information AFI. The test operation mentioned above will be repeated until the accumulate fail information AFI is generated with respect to all of the memory blocks or a predetermined portion of the memory cell blocks requiring the test operation.

Figure 4:
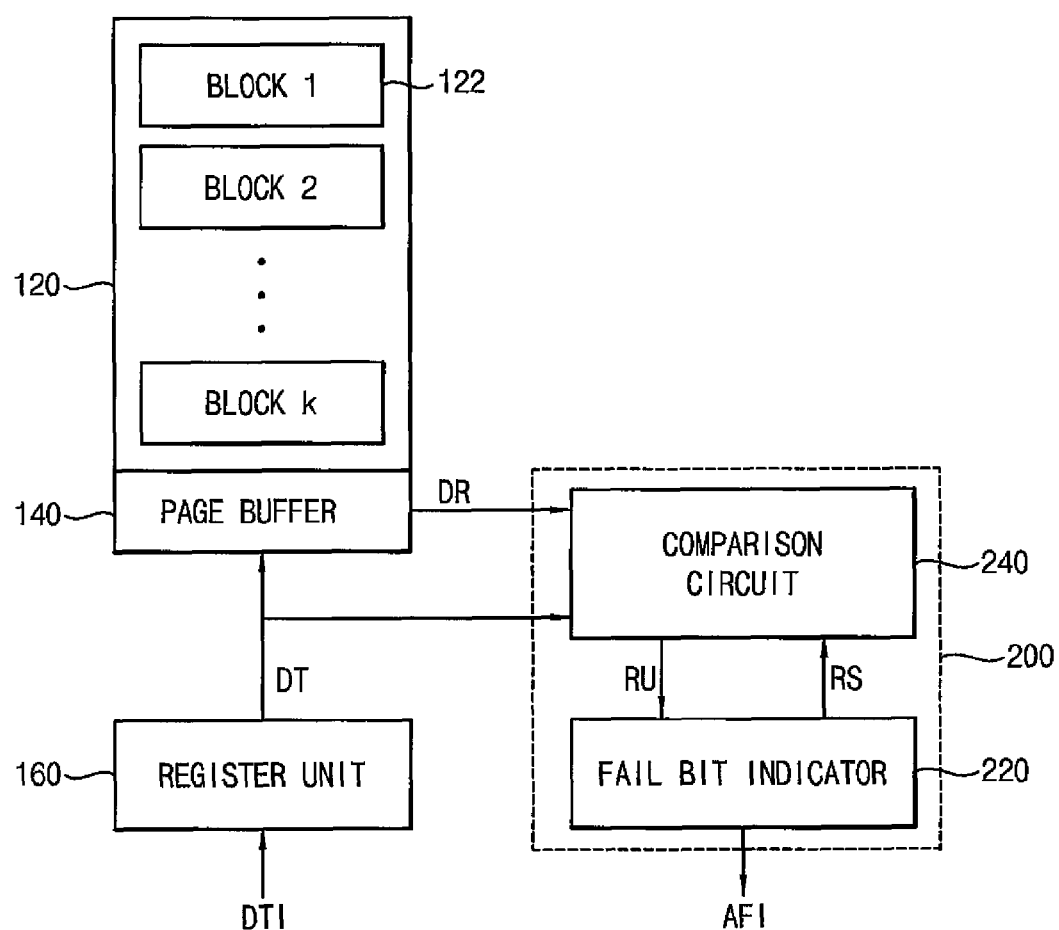
FIG. 4 is a block diagram illustrating a semiconductor memory device according to some embodiments of the inventive concept.

FIG. 4 is a block diagram illustrating a semiconductor memory device according to some embodiments of the inventive concept. Referring to FIG. 4, a semiconductor memory device 20 may include a memory cell array 120 and a fail detection circuit 200. A memory cell array 120 may correspond to various types of memory such as a dynamic random access memory (DRAM), a static RAM (SRAM), and a non-volatile memory like flash memory. For example, the memory cell array 120 may correspond to a flash memory cell array, and the semiconductor memory device 20 may further include a page buffer 140 commonly connected to a plurality of memory blocks 122 included in the flash memory cell array. The page buffer 140 may include a plurality of registers a number of which is the same as a number of bits corresponding to one page, which is a unit of each read operation or each program operation. During the read operation, the page buffer 140 latches the read data from the memory cell array 120 and outputs the latched read data to the external device. During the program operation, the page buffer 140 receives writing data from the external device and applies the received writing data to each bit line.

For example, the semiconductor memory device 20 may further include a register unit 160 storing the test data DT. The register unit 160 receives and stores input test data DTI, and outputs the test data DT to the memory core in response to a timing control signal provided from the external device such as the host 40 and so on. The input test data DTI may have various patterns according to the method of testing. For example, the input test data DTI may be generated based on data provided from an external tester, or may be provided by a test pattern generator (not shown) included in the semiconductor memory device 20. A number of bits of the register unit 160 is not required to be the same as a number of bits of the page buffers 140. The register unit 160 may provide the test data DT to the page buffer 140 by repeatedly using the same test data patterns, and thus the number of bits of the register unit 160 may be smaller than the number of bits of the page buffers 140.

In a conventional flash memory device, the fail information may be stored in the page buffer after programming the same test data to the whole of the memory cells. In contrast, the semiconductor memory device 20 according to the inventive concept accumulatively stores the fail information in the fail bit indicator 220, not in the page buffer, so that the semiconductor memory device 20 may obtain the fail information using test data of various patterns.

As illustrated in FIG. 4, the memory cell array 120 may include a plurality of memory blocks 122 (BLOCK 1, BLOCK2, . . . , BLOCKk). Each memory block 122 may include a plurality of memory cells arranged in matrix form. Each memory cell is connected to a corresponding word line in the row direction and a corresponding bit line in the column direction, respectively.

The fail detection circuit 200 compares the read data DR with the original test data DT provided from the register unit 160, and then generates a comparison signal representing whether the memory cell is failed or not. The read data DR are read out from the memory cells after the test data DT are written in the memory cells. The fail detection circuit 200 accumulates and stores the fail information of the memory cells corresponding to the plurality of addresses based on the comparison signal to output the accumulated fail information AFI.

For example, the accumulated fail information AFI may be output with respect to each memory block. When all of the read data DR read out from the memory cells included in one memory block are compared with the corresponding test data DT, the accumulated fail information AFI may be output as illustrated in FIG. 3. The accumulated fail information AFI may be output with respect to another unit other than a memory block unit. For example, the accumulated fail information AFI may be output with respect to a predetermined unit corresponding to a unit of repair operation. The fail detection circuit 200 sequentially accumulates and stores the fail information with respect to the plurality of lower addresses different from each other and corresponding to an upper address identical to each other, and then the accumulated fail information AFI with respect to the upper address may be output when all of the memory cells corresponding to the upper address are tested by comparing the read data DR with the test data DT. In FIG. 3, the upper address ADD_Ui may correspond to an address designating each memory block and the lower address ADD_L1 to ADD_L4 may correspond to an address designating each word line or each page.

The fail detection circuit 200 may include a fail bit indicator 220 and a comparison circuit 240. The fail bit indicator 220 may store the temporary accumulated fail information and output the accumulated fail information AFI.

The comparison circuit 240 sequentially compares the read data DR with the test data DT, generates the comparison signal CMP with respect to each address, and generates an update signal RU for updating the temporary accumulated fail information stored in the fail bit indicator 220 based on the comparison signal CMP. For example, the comparison circuit 240 receives a state signal RS representing the temporary accumulated fail information currently stored in the fail bit indicator 220 during the accumulating operation to generate the update signal RU. Detailed operation related to the update signal RU will be described with reference to FIGS. 5 and 6.

As mentioned above with reference to FIG. 3, the fail bit indicator 220 may include a plurality of registers a number of which is the same as the number of bits of the read data DR output from the memory core 100 during each read operation. For example, the fail detection circuit 200 may include the fail bit indicator 220 having the plurality of registers the number of which is the same as a number of bits corresponding to the one page of the flash memory cell, when the memory cell array 120 corresponds to the flash memory cell array. The single register may be various storage devices for storing one bit such as a latch, a flip-flop and so on.

Figure 5:
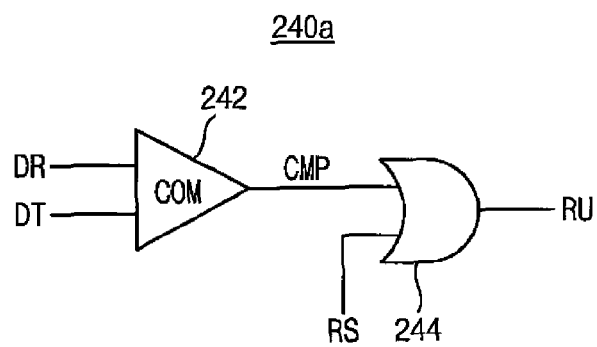
FIG. 5 is a circuit diagram illustrating an example of the comparison circuit included in the semiconductor memory device of FIG. 4.
Figure 6:
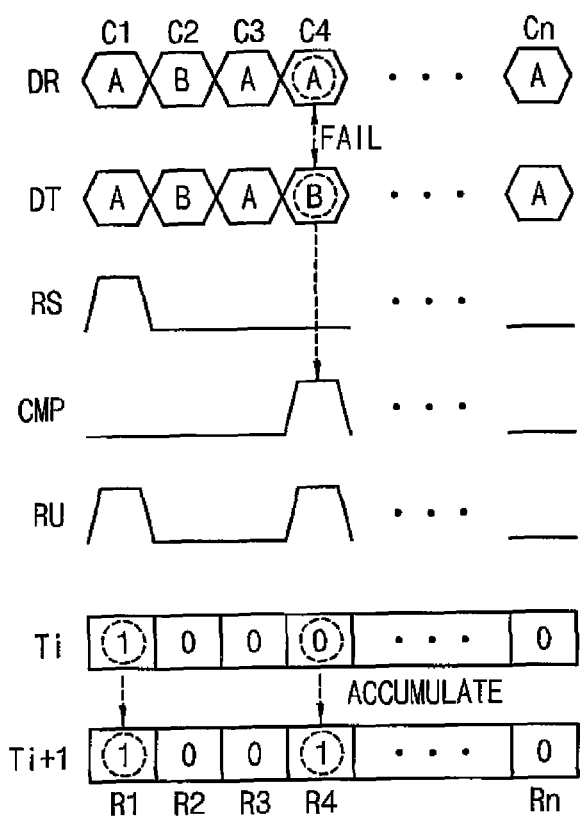
FIG. 6 is a diagram illustrating an example of the accumulation operation performed by the comparison circuit of FIG. 5.

FIG. 5 is a circuit diagram illustrating an example of the comparison circuit included in the semiconductor memory device of FIG. 4, and FIG. 6 is a diagram illustrating an example of the accumulation operation performed by the comparison circuit of FIG. 5.

Referring to FIG. 5, a comparison circuit 240a may include a comparator 242 and a logic gate 244. The comparator 242 generates a comparison signal CMP based on the read data DR and the test data DT. For example, the comparison signal CMP may be disabled to a logic state "low" when the read data DR are the same as the test data DT, and the comparison signal CMP may be enabled to a logic state "high" when the read data DR are different from the test data DT. In the flash memory device, the read data DR may be simultaneously read out from the one page including the plurality of memory cells connected to the same word line, and the plurality of bits of the read data DR are sequentially output by the page buffer. In this case, the logic state of the comparison signal CMP may be sequentially determined in synchronization with each bit of the read data DR and the test data DT as illustrated in FIG. 6.

The logic gate 244 generates the update signal RU based on the comparison signal CMP and the state signal RS representing the temporary accumulated fail information stored in the fail bit indicator 220. The logic gate 244 enables the update signal RU to the logic state "high" when at least one of the comparison signal CMP and the state signal RS corresponds to the logic state "high". For example the logic gate 244 may perform a logical OR operation and the logic gate 244 may correspond to an OR gate.

Hereinafter, an accumulation operation of the fail information will be described with reference to FIGS. 5 and 6. FIG. 6 illustrates an example of updating the temporary accumulated fail information with respect to one page, when one page in the flash memory device includes n-bits corresponding to columns C1 to Cn. The fail bit indicator 220 updates the temporary accumulated fail information from a first state Ti to a second state Ti+1. The test data DT may have various patterns, e.g., A, B, A, B, . . . and A as illustrated in FIG. 6. The state signal RS represents that the first bit R1 of the temporary accumulated fail information of the first state Ti exclusively corresponds to the value of "1", which indicates that the first column C1 includes at least one defective memory cell as the result of the previously performed test operation. When the read data DR and the test data DT of the fourth column C4 are different from each other with respect to the currently tested page, a memory cell of the fourth column C4 in the currently tested page is defective. The logic gate 244 performs a logical operation on the comparison signal CMP and the state signal RS, and outputs the update signal RU such that the first and fourth bits of the update signal RU correspond to the logic state "high". The fail bit indicator 220 updates the temporary accumulated fail information of the first state Ti to the second state Ti+1 based on the update signal RU. The first and fourth bit R1 and R4 of temporary accumulated fail information of the second state Ti+1 stored in the fail bit indicator 220 exclusively correspond to the value of "1" to indicate that the first and fourth column of the memory cells have the at least one failed memory cell, respectively.

For accumulating the fail information, the fail bit indicator 220 may include a plurality of latches a number of which is the same as the number of bits of the read data DR output from the memory core 100 with respect to the each read operation. When the corresponding bit of the update signal RU is applied to the plurality of latches, each of the latches may respectively update the stored value in response to the update signal RU.

Figure 7:
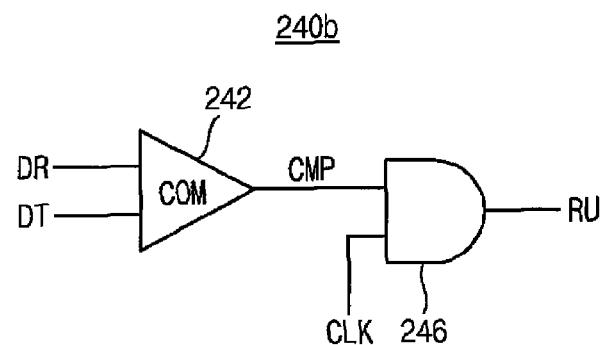
FIG. 7 is a circuit diagram illustrating another example of the comparison circuit included in the semiconductor memory device of FIG. 4.
Figure 8:
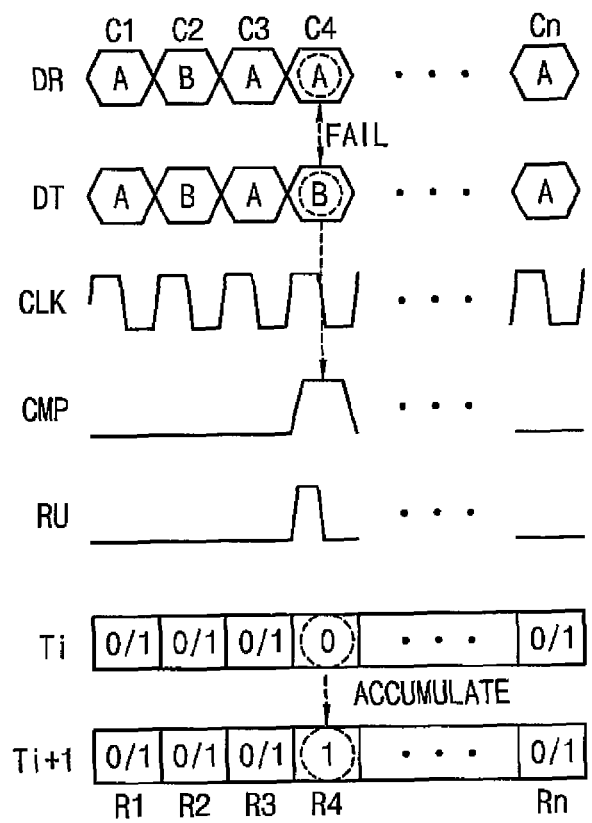
FIG. 8 is a diagram illustrating an accumulation operation of fail information performed by the comparison circuit of FIG. 7.

FIG. 7 is a circuit diagram illustrating another example of the comparison circuit included in the semiconductor memory device of FIG. 4, and FIG. 8 is a diagram illustrating the accumulating operation of the fail information performed by the comparison circuit of FIG. 7.

Referring to FIG. 7, a comparison circuit 240b may include a comparator 242 and a logic gate 246. The comparator 242 generates the comparison signal CMP based on the read data DR and the test data DT. As mentioned above, the comparison signal CMP may be disabled to the logic state "low" when the read data DR are the same as the test data DT, and the comparison signal CMP may be enabled to a logic state "high" when the read data DR are different from the test data DT. In flash memory devices, the read data DR may be simultaneously read out from the one page including the plurality of memory cells connected to the same word line, and the plurality of bits of the read data DR are sequentially output by the register. In this case, the logic state of the comparison signal CMP may be sequentially determined in synchronization with each bit of the read data DR and the test data DT, as illustrated in FIG. 8.

The logic gate 246 generates the update signal RU in a pulse form based on a clock signal CLK and the comparison signal CMP. For example, the logic gate 246 may be an AND gate as shown in FIG. 7 that performs a logical AND operation on the clock signal CLK and the comparison signal CMP. When the comparison signal CMP is enabled, the logic gate 246 generates the update signal RU with a pulse having a half period compared to the clock signal CLK as illustrated in FIG. 7. Alternatively, the logic gate 246 may be replaced with a pulse generator generating a pulse signal having a predetermined pulse width.

Hereinafter, the accumulating operation will be described with reference to FIGS. 7 and 8. FIG. 8 illustrates an example of updating the temporary accumulated fail information with respect to one page, when one page in the flash memory device includes n-bits corresponding to columns C1 to Cn. The fail bit indicator 220 updates the temporary accumulated fail information from a first state Ti to a second state Ti+1. The test data DT may have various patterns, e.g., A, B, A, B, . . . and A as illustrated in FIG. 8. In FIG. 5, the update signal RU is generated based on the state signal RS representing the temporary accumulated fail information currently stored in the fail bit indicator 220 and the comparison signal CMP. In contrast, referring to FIG. 7, the update signal RU is generated exclusively based on the comparison signal CMP. A denotation "0/1" illustrated in the first, second, third and n-th bits R1, R2, R3 and Rn of the first state Ti and the second state Ti+1 represents that bit values of the temporary accumulated fail information remains the same during testing of the one page. In other words, when the update signal RU is disabled, a bit that previously had the value of "0," maintains the value of "0" and a bit that previously had the value of "1" maintains the value of "1", respectively. When the update signal RU is enabled as illustrated in FIG. 8, the fourth bit R4 of the temporary accumulated fail information of the first state Ti having the value of "0" is updated, so that a fourth bit R4 of the temporary accumulated fail information of the second state Ti+1 has the value of "1". In a case where the fourth bit R4 of the temporary accumulated fail information of the first state Ti has the value of "1", the fourth bit R4 maintains the value of "1" regardless of the update signal RU.

The fail bit indicator 220 may include a plurality of flip-flops a number of which is the same as the number of bits of the read data DR output from the memory core 100 in FIG. 1 with respect to each read operation. For example, the flip-flop may be a set/reset flip-flop implemented with cross-coupled NOR gates. The set/reset flip-flop respectively stores each bit of the temporary accumulated fail information included in the fail bit indicator 220. The set/reset flip-flop may set the stored value to the value of "1" in response to a rising edge of each pulse of the update signal RU. After the set/reset flip-flop sets the value of "1", the set/reset flip-flop maintains the previously stored value "1" even if the update signal RU having the pulse is applied thereto. Only when the set/reset flip-flop is reset to the initial state, the set value of "1" is reset to the value of "0". For example, when the accumulated fail information is output after the test operation is completed with respect to all of the lower addresses pertaining to the same upper address, the set/reset flip-flop may be set to the value of "0" for preparing the next test operation with respect to another upper address.

Figure 9:
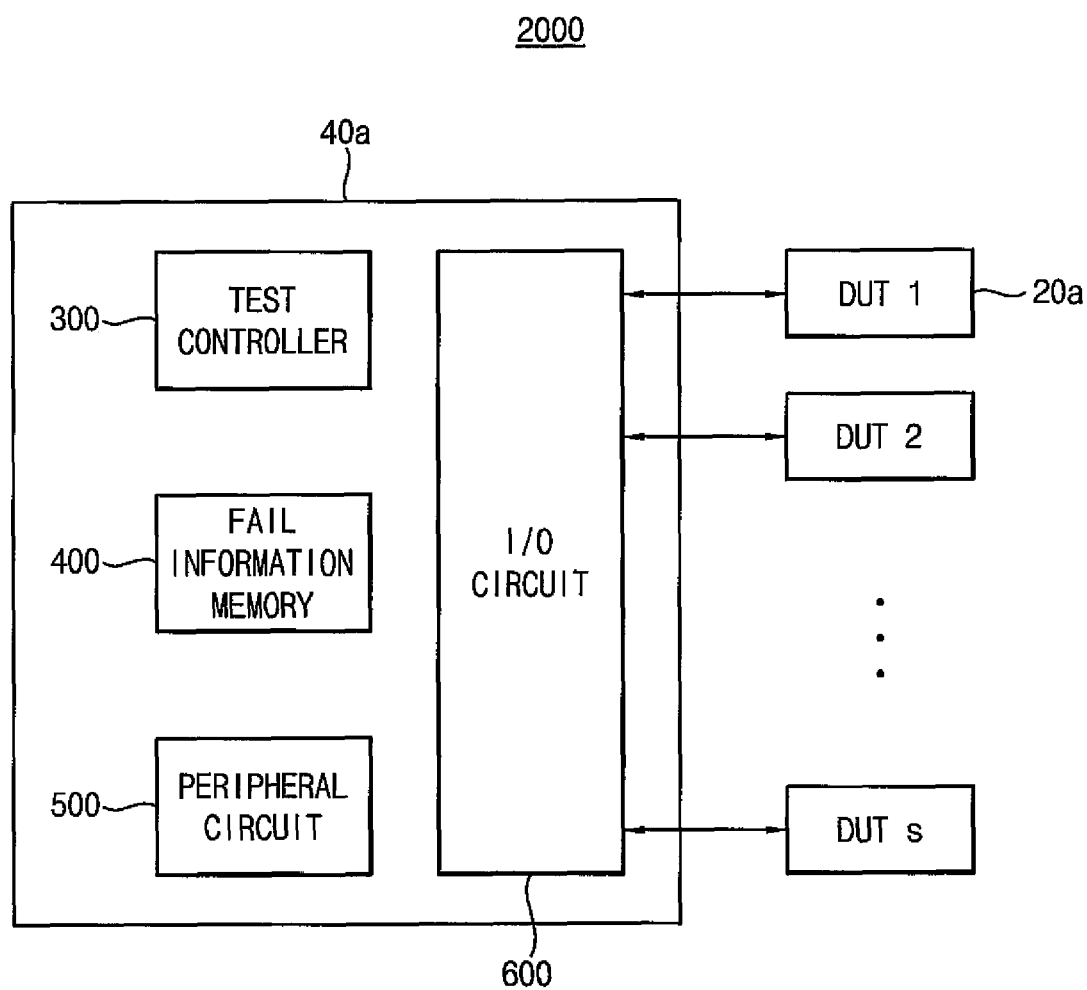
FIG. 9 is a block diagram illustrating a test system according to some embodiments of the inventive concept.

FIG. 9 is a block diagram illustrating a test system according to some example embodiments of the inventive concept. Referring to FIG. 9, a test system 2000 includes a plurality of semiconductor memory devices 20a and a tester 40a testing the semiconductor memory devices 20a in parallel. The semiconductor memory devices 20a may respectively correspond to a device under test (DUT). Each semiconductor memory device 20a may include the memory core including the memory cell array and the fail detection circuit as described with reference to FIGS. 1 to 8. The fail detection circuit compares the read data with the test data to generate the comparison signal representing whether the corresponding memory cell is failed or not, and accumulates and stores the fail information of the corresponding memory cell to output the accumulated fail information to the tester 40a. The fail detection circuit may include the fail bit indicator and the comparison circuit. The comparison circuit sequentially generates the comparison signal with respect to each lower address, and generates the update signal for updating the bit values stored in the fail bit indicator based on the comparison signal.

The tester 40a may include a test controller 300 for controlling, a fail information memory 400, a peripheral circuit 500, and an input/output (I/O) circuit 600. The fail information memory 400 stores the accumulated fail information received from the plurality of semiconductor memory devices 20a. The I/O circuit 600 respectively transmits the test data or test data information and respectively receives the accumulated fail information from the semiconductor memory devices 20a.

As illustrated in FIG. 9, the tester 40a tests the plurality of semiconductor memory devices 20a in parallel to reduce a test time. The fail information memory 400 stores the accumulated fail information for performing a repair operation which substitutes redundant memory cells for failed memory cells. As a number of the semiconductor memory devices simultaneously tested in parallel increases, a capacity of the fail information memory 400 included in the tester 40a increases.

Figure 10:
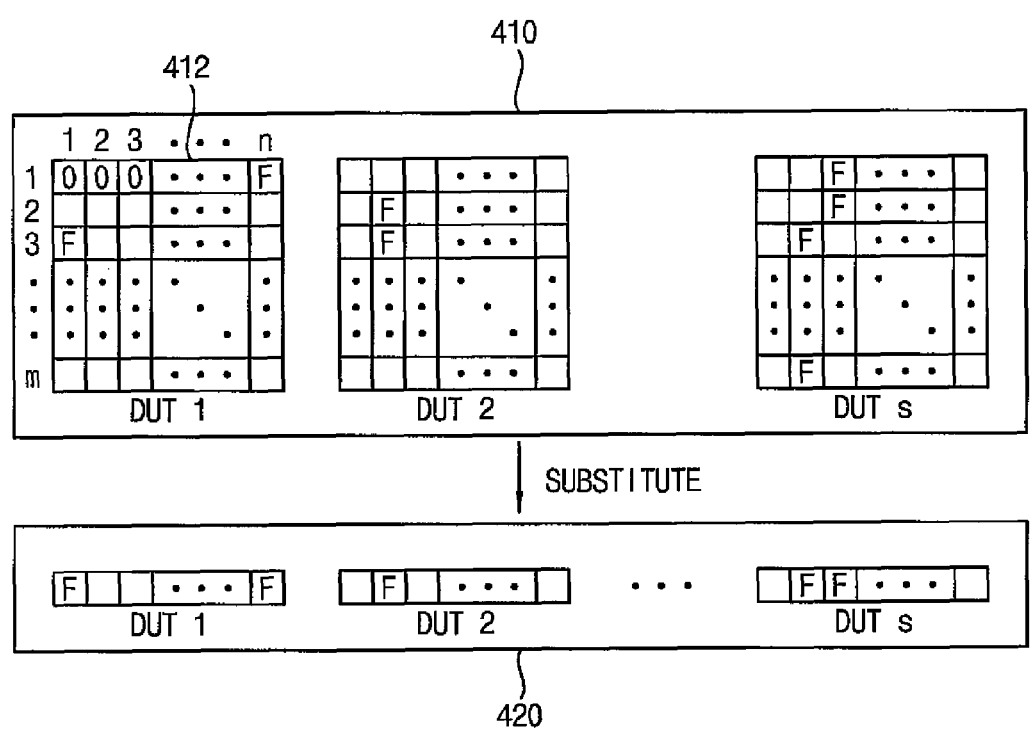
FIG. 10 is a diagram illustrating examples of memory included in conventional tester devices and the tester of FIG. 9 for storing the fail information.

FIG. 10 is a diagram illustrating examples of memory included in conventional tester devices and the tester of FIG. 9 for storing the fail information. Referring to FIG. 10, a first memory 410 may correspond to a memory for storing the fail information included in the conventional tester. A second memory 420 may correspond to a memory for storing the accumulated fail information received from the semiconductor memory devices 20a.

The conventional tester receives and stores all of the fail information from the memory cell included in the DUT such as semiconductor memory devices. When the memory block included in the semiconductor memory device has the memory cells arranged in m-rows and n-columns, the first memory 410 may be required to have the memory capacity of m*n bits with respect to each DUT. Alternatively, because the semiconductor memory device 20a according to the inventive concept provides the accumulated fail information by using the fail detection circuit, the second memory 420 may be required to have the memory capacity of n bits with respect to each DUT when the memory block has memory cells arranged in m-rows and n-columns and the repairing operation is performed with respect to the each column. The memory capacity of the memory for storing the accumulated fail information included in the tester 40a may be significantly reduced as a number of DUT simultaneously tested increases.

The system according to some example embodiments may be various systems as mentioned above. For example, the semiconductor memory device 20 may include a flash memory device, the host 40 may include a memory controller, and the system 1000 of FIG. 1 may include a memory card implemented with the flash memory device and the memory controller. The memory card may communicate with the exterior through at least one of interface protocols such as a universal serial bus (USB), a multimedia Card (MMC), a Peripheral Component Interconnect-Express (PCI-E), a Serial Advanced Technology Attachment (SATA), a Parallel Advanced Technology Attachment (PATA), a small computer system interface (SCSI), an enhanced small device interface (ESDI), and an integrated drive electronics (IDE). The system 1000 of FIG. 1 may include a solid state drive/disk (SSD).

For example, the system 1000 of FIG. 1 may include a mobile handset, and the mobile handset may include the flash memory device and the memory controller. As demands for the mobile handset such as a cellular phone, a personal digital assistant (PDA), a digital camera, a portable game console, and a MP3 player increases, the flash memory device may be broadly used as code storages as well as data storages. For example, the system 1000 of FIG. 1 may be a computing system including a flash memory device and a memory controller. In such case, the system 1000 may further include a microprocessor electrically connected to a bus, a user interface, and a modem like a baseband chipset. When the computing system according to some example embodiments is a mobile device, the computing system may further include a battery for supplying operation power supply voltage. The computing system may further include an application chipset, a camera image processor (CIS), a mobile DRAM and so on.

The system according to the inventive concept may be mounted on various packages. The package may include functional blocks according to the system and/or peripheral devices as well as the flash memory device and the memory controller. For example, the package may include a PoP (Package on Package), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), a Wafer-Level Processed Stack Package (WSP) and so on.

Example embodiments are not limited to a specific memory device but may be adopted in all kinds of memory devices such as DRAM, SRAM, and non-volatile memory devices including a flash memory device. Particularly example embodiments may be adopted in a semiconductor memory device, which performs the repair operation for the respective row or column, and a system including the semiconductor memory device.

While the example embodiments of the inventive concept and their advantages have been described in detail, it should be understood that various changes, substitutions and alternations may be made without departing from the scope of the inventive concept.

What is claimed is:

1. A semiconductor memory device, comprising:
a memory core including a memory cell array having a plurality of memory cells, the memory core configured to program write test data received from an external host into the respective plurality of memory cells, and to output read test data from the respective plurality of memory cells; and
a fail detection circuit, which is separate from the memory core and functions independently from a data program and read function of the memory core, configured to receive the read test data from the memory core, and to compare the read test data with the write test data for each of the plurality of memory cells, and to generate a comparison signal indicative of whether each of the memory cells has failed,
the fail detection circuit further configured to accumulate and store fail information of the memory cells corresponding to a plurality of addresses based on the comparison signal, and to output accumulated fail information,
wherein the fail detection circuit includes a fail bit indicator configured to store temporary accumulated fail information and output the accumulated fail information, the temporary accumulated fail information including a plurality of bits, each of the bits indicating whether at least one of memory cells included in each column of the memory cell array has a defect.

2. The semiconductor memory device of claim 1, wherein the plurality of memory cells correspond to a plurality of upper addresses, and
wherein the fail detection circuit is configured to accumulate and store the fail information of the memory cells corresponding to each upper address of the upper addresses and corresponding to a plurality of lower addresses different from each other and the accumulated fail information represents whether the memory cells corresponding to each upper address are failed or not with respect to each column of the memory cell array.

3. The semiconductor memory device of claim 2, wherein each upper address designates a memory block, and each lower address designates a word line or a page of the memory block.

4. The semiconductor memory device of claim 1, wherein the fail detection circuit further comprises:
a comparison circuit configured to sequentially generate the comparison signal for the plurality of addresses, and to generate an update signal to update the temporary accumulated fail information stored in the fail bit indicator based on the comparison signal.

5. The semiconductor memory device of claim 4, wherein the fail bit indicator comprises:
a plurality of registers, a number of which corresponds to a number of bits of the read test data output from the memory core with respect to each read operation.

6. The semiconductor memory device of claim 4, wherein the comparison circuit comprises:
a comparator configured to generate the comparison signal based on the read test data and the write test data; and
a logic gate configured to generate the update signal based on a state signal and the comparison signal, the state signal representing the temporary accumulated fail information stored in the fail bit indicator.

7. The semiconductor memory device of claim 6, wherein the fail bit indicator comprises:
a plurality of latches, a number of which corresponds to a number of bits of the read test data output from the memory core with respect to each read operation.

8. The semiconductor memory device of claim 4, wherein the comparison circuit comprises:
a comparator configured to generate the comparison signal based on the read test data and the write test data; and
a logic gate configured to generate the update signal based on a clock signal and the comparison signal, the update signal having a pulse form.

9. The semiconductor memory device of claim 8, wherein the fail bit indicator comprises:
a plurality of flip-flops, a number of which corresponds to a number of bits of the read test data output from the memory core with respect to each read operation.

10. The semiconductor memory device of claim 1, wherein the memory cell array corresponds to a flash memory cell array, and
the memory core further comprises a page buffer commonly connected to a plurality of memory blocks included in the flash memory cell array.

11. The semiconductor memory device of claim 10, wherein the fail detection circuit comprises:
a plurality of registers, a number of which corresponds to a number of bits corresponding to one page.

12. The semiconductor memory device of claim 1, further comprising:
a register unit configured to store the write test data.

13. A semiconductor memory device, comprising:
a memory core including a memory cell array having a plurality of memory cells, the memory core configured to program write test data into the respective plurality of memory cells, and configured to output read test data from the respective plurality of memory cells; and
a fail detection circuit including a fail bit indicator, the fail detection circuit configured to reset all of bits of accumulated fail information stored in the fail bit indicator to initial values, configured to compare first read test data corresponding to a first read address with the write test data bit-by-bit to generate a first comparison result, configured to change a first bit of the accumulated fail information from the initial value to a fail value based on the first comparison result if a first read test data bit in the first read test data is different from a first write test data bit in the write test data, and configured to maintain a second bit of the accumulated fail information to a previous value based on the first comparison result if a second read test data bit in the first read test data is the same as a second write test data bit in the write test data, the first read test data bit and the first write test data bit corresponding to the first bit of the accumulated fail information, the second read test data bit and the second write test data bit corresponding to the second bit of the accumulated fail information,
wherein the first read address is changed into a second read address and the fail detection circuit repeats the comparing operation, the changing operation and the maintaining operation with respect to the second read address and second read test data corresponding to the second read address, and
wherein the semiconductor memory device outputs the accumulated fail information when the comparing operation, the changing operation and the maintaining operation is completed with respect to a predetermined number of the read addresses.

14. The semiconductor memory device of claim 13, wherein the memory cell array corresponds to a flash memory cell array, and
the memory core further comprises a page buffer commonly connected to a plurality of memory blocks included in the flash memory cell array,
wherein the page buffer latches the read test data from the respective plurality of memory cells corresponding to one page and provide the latched read test data to the fail detection circuit with respect to each read operation.

15. The semiconductor memory device of claim 14, wherein the fail bit indicator comprises:
a plurality of registers, a number of which corresponds to a number of bits corresponding to one page.

16. The semiconductor memory device of claim 14, further comprising:
a register unit, a number of which is smaller than a number of bits corresponding to one page, the register unit configured to receive and store input test data, and configured to provide the write test data to the memory core by repeatedly using the same input test data patterns.

17. The semiconductor memory device of claim 13, wherein the memory cell array corresponds to a flash memory cell array, and
wherein each read address corresponds to one page and the predetermined number of the read addresses corresponds to one memory block.

18. A test system, comprising:
a plurality of semiconductor memory devices; and
a tester configured to test the plurality of semiconductor memory devices in parallel,
wherein each of the semiconductor memory devices, includes
a memory core including a memory cell array having a plurality of memory cells, the memory core configured to program write test data received from the tester into the respective plurality of memory cells, and configured to output read test data from the respective plurality of memory cells, and
a fail detection circuit including a fail bit indicator, the fail detection circuit configured to reset all of bits of accumulated fail information stored in the fail bit indicator to initial values, configured to compare first read test data corresponding to a first read address with the write test data bit-by-bit to generate a first comparison result, configured to change a first bit of the accumulated fail information from the initial value to a fail value based on the first comparison result if a first read test data bit in the first read test data is different from a first write test data bit in the write test data, and configured to maintain a second bit of the accumulated fail information to a previous value based on the first comparison result if a second read test data bit in the first read test data is the same as a second write test data bit in the write test data, the first read test data bit and the first write test data bit corresponding to the first bit of the accumulated fail information, the second read test data bit and the second write test data bit corresponding to the second bit of the accumulated fail information, wherein the first read address is changed into a second read address by the tester and the fail detection circuit repeats the comparing operation, the changing operation and the maintaining operation with respect to the second read address and second read test data corresponding to the second read address, and wherein each of the semiconductor memory devices outputs the accumulated fail information when the comparing operation, the changing operation and the maintaining operation is completed with respect to a predetermined number of read addresses, wherein the plurality of semiconductor memory devices sequentially provides the corresponding accumulated fail information to the tester.

* * * * *